US 6,639,808 B1

(12) United States Patent
Umberger (10) Patent No.: US 6,639,808 B1
(45) Date of Patent: Oct. 28, 2003

(54) CARD GUIDE SYSTEM (75) Inventor: Philip G. Umberger, Chaska, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 262 days.

(21) Appl. No.: 09/723,917

(22) Filed: Nov. 28, 2000

(51) Int. Cl.[7] .................................................. H05K 7/14
(52) U.S. Cl. ...................... 361/797; 361/737; 361/802; 361/796; 439/377; 257/99
(58) Field of Search ............................... 361/747, 752, 361/724, 816, 800, 796, 690, 797, 818, 737, 756, 727, 686, 802, 741; 174/730, 51, 35 R; 257/99; 439/377

(56) References Cited

U.S. PATENT DOCUMENTS

| 3,878,438 | A |   | 4/1975 | Weisman |           |
|-----------|---|---|--------|---------|-----------|
| 4,189,200 | A |   | 2/1980 | Yeager et al. | |
| 4,201,303 | A |   | 5/1980 | Smith   |           |
| 4,232,356 | A | * | 11/1980 | Saunders et al. | 361/797 |
| 4,519,016 | A | * | 5/1985 | Bradley et al. | 361/802 |
| 4,779,744 | A | * | 10/1988 | Shely et al. | 211/41.17 |
| 5,172,306 | A |   | 12/1992 | Cantrell | |
| 5,398,161 | A |   | 3/1995 | Roy | |
| 5,642,264 | A |   | 6/1997 | Cantrell | |
| 5,680,296 | A |   | 10/1997 | Hileman et al. | |
| 5,923,532 | A |   | 7/1999 | Nedved | |
| 6,304,456 | B1 | * | 10/2001 | Wortman | 361/796 |

* cited by examiner

Primary Examiner—David Martin
Assistant Examiner—Hung Bui
(74) Attorney, Agent, or Firm—Fogg and Associates, LLC; Laura A. Ryan (57) ABSTRACT A card guide system is provided. The card guide system comprises a chassis having a top and a bottom frame portion. The top and bottom frame portions each include a plurality of card guide members disposed thereon. The card guide members of the top frame portion are a mirror image of the card guide members of the bottom frame portion. In addition, the plurality of card guide members are adapted to receive a circuit card and secure the circuit card using tension, wherein when the circuit is received by the card guide members the circuit card is bowed.

21 Claims, 6 Drawing Sheets

Fig. 7

CARD GUIDE SYSTEM

TECHNICAL FIELD

The present invention relates generally to a card guide system, and in particular to a system for securing circuit cards in a card mounting enclosure.

BACKGROUND

In many applications, electronics mounted on circuit cards or embedded within circuit cards such as printed circuit boards are sensitive to movement, vibration, temperature and other external parameters.

Enclosures for mounting circuit cards and/or printed circuit boards are used for computer systems, telecommunications systems to include switching terminals, head end terminals, remote units, repeater housings and the like, and other systems that utilize a plurality of electronics. Problems that plague card-mounting enclosures include the build-up of heat within the enclosures, the effects of movement and vibration, electrical connectivity, and the like. In particular, a number of telecommunications systems house circuit cards that are sensitive to vibration. Vibration may lead to bit errors as well as noise on the phone lines. Current chassis do not provide these cards adequate protection against vibration. The cards are loose in the chassis and are allowed to move. Some computer chassis are designed to secure cards in place using mechanically employed devices such as spring devices within a channel. Manufacturing for mechanically employed restraint systems is expensive as well as time consuming. In addition, for some mechanical devices, parts are lost easily and the channels are difficult to repair when broken.

For the reasons stated above, and for other reasons stated below which will become apparent to those skilled in the art upon reading and understanding the present specification, there is a need in the art for techniques that reduce the effect of vibration on electrical systems.

SUMMARY

The above mentioned problems with chassis of electrical systems that are susceptible to vibrations are addressed by embodiments of the present invention and will be understood by reading and studying the following specification.

In one embodiment, a chassis is provided. The chassis includes a bottom frame portion having at least one set of card guide members. The at least one set of card guide members is adapted to receive a circuit card and secure the circuit card using tension. When the circuit card is received by the at least one set of card guide members the circuit card is bowed.

In another embodiment, a card guide system is provided. The card guide system comprises a chassis having a top and a bottom frame portion. The top and bottom frame portions each including a plurality of card guide members disposed thereon. The card guide members of the top frame portion are a mirror image of the card guide members of the bottom frame portion. In addition, the plurality of card guide members are adapted to receive a circuit card and secure the circuit card using tension, wherein when the circuit is received by the card guide members the circuit card is bowed.

In an alternate embodiment, a host digital terminal is provided. The host digital terminal includes a card mounting enclosure having a first side and a second opposing side. The first and second sides each having a plurality of sets of card guide members disposed thereon. The sets of card guide members of the first side each include a matching set of card guide members disposed on the second side. Matching sets of card guide members are adapted to receive a circuit card and secure the circuit card using tension. When the circuit card is received by matching sets of card guide members the circuit card is bowed. The host digital terminal further includes a plurality of circuit cards. Each of the plurality of circuit cards is secured by a matching set of card guide members.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The present invention is a structure for containing printed circuit boards or circuit cards. Electrical and electronic components such as integrated circuit devices, processors, memory devices, or the like are mounted on each of the circuit cards. During operation these components can be affected by vibration or movement that degrades the performance of the system they are mounted in or damages the components themselves. This invention provides a way to reduce the effects of vibration and/or movement of circuit cards. The cards are secured using tension and when held in place the cards are slightly bowed. For purposes of this specification slightly bowed means that the amount of bow is enough to secure the cards in place and less than or equal to the allowed amount of bow for each specified card.

Figure 1:
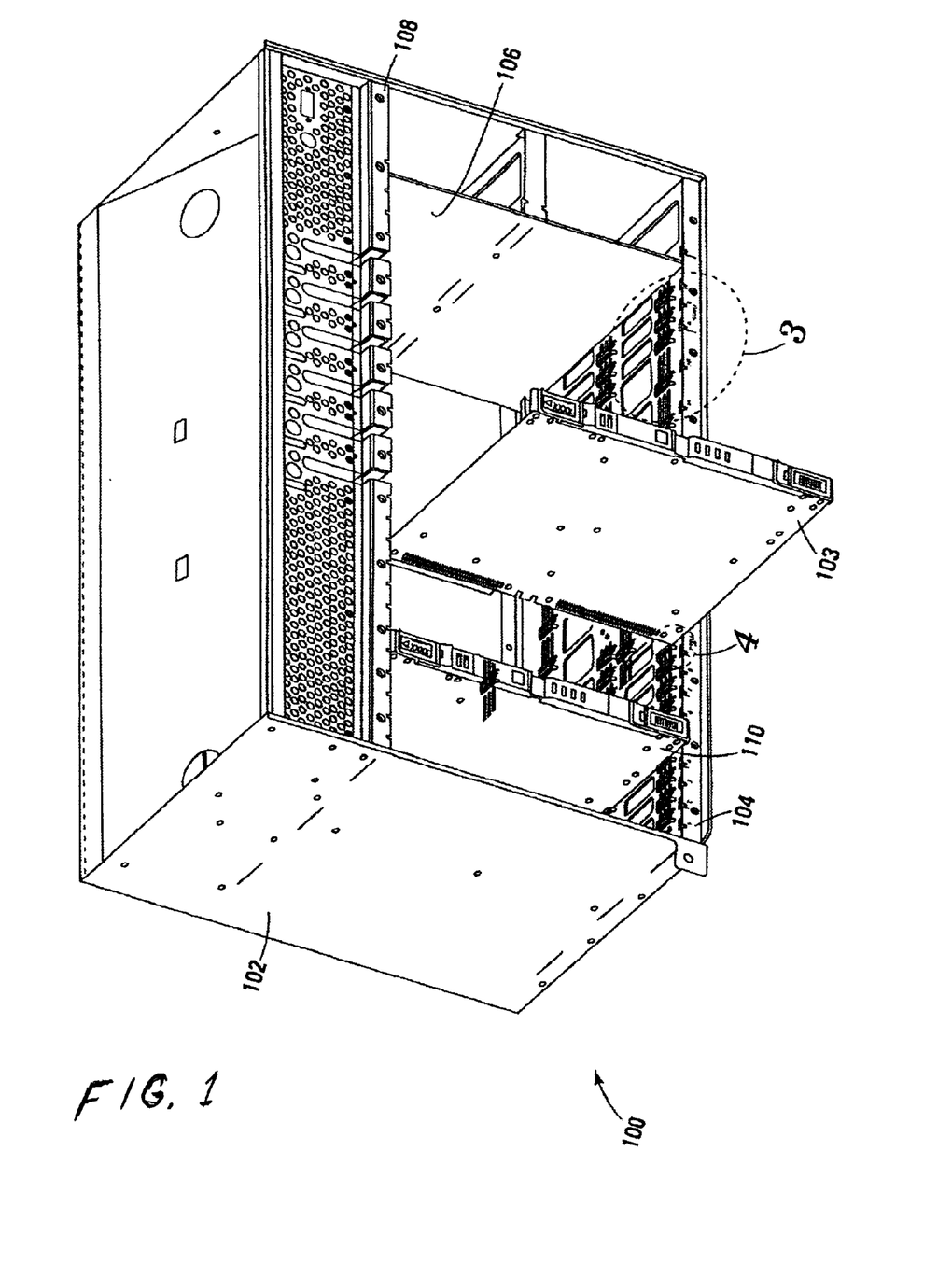
FIG. 1 is an illustration of one embodiment of a card chassis according to the teachings of this invention.

FIG. 1 is an illustration of one embodiment of a card chassis, shown generally at 100, and constructed according to the teachings of this invention. Chassis 100 is generally rectangular in shape and comprised of side panels 102 and 106 coupled to a top and bottom frame portion 108 and 104, respectively. The side panels 102 and 106 are mounted perpendicular to the top and bottom frame portions 108 and 104. In one embodiment, the top and bottom frame portions 108 and 104 are coupled to frame structures or support members other than side panels 102 and 106. In one embodiment, the frame structures include one or more brackets, posts, panels, beams or the like.

Chassis 100 can hold up to 21 circuit cards at one time, however only 2 cards, 103 and 110, are shown for illustration purposes. In other embodiments, a chassis such as chassis 100 may be built to hold as many cards as required for the specific application.

In one embodiment, top frame portion 108 and bottom frame portion 104 each include a plurality of sets of card guide members. In one embodiment, the top and bottom frame portions 108 and 104 are mirror images of each other, e.g., the plurality of sets of card guide members on the top frame portion 108 is identical to the plurality of sets of card guide members on the bottom frame portion 104 but with the structure reversed. In one embodiment, each set of card guide members is comprised of three single card guide members. In another embodiment, each set of card guide members is comprised of three pairs of card guide members. Each set of card guide members on the top frame portion 108 has a matching set of card guide members on the bottom frame portion 104. The matching sets of card guide members are aligned to allow a card such as 103 or 110 to be slid into the matching sets of card guide members and be secured on opposing edges of the card. For brevity, only the bottom frame portion 104 will be described in detail. In one embodiment, the bottom frame portion 104 is formed from a flat piece of sheet metal or other material that is formed by an apparatus that punches, stamps, bends or shears the material into the desired shape. In other embodiments, the bottom frame portion 104 is formed from plastic, composite or the like that is molded, extruded or otherwise formed into the shape required. The length and width of the chassis 100 varies based on the number and size of the circuit cards and other equipment required for a specific application.

In one embodiment, card chassis 100 houses telecommunications switching electronics. It is understood that although a telecommunications host digital terminal is shown in FIG. 1 this invention may include any card mounting enclosure.

Figure 2:
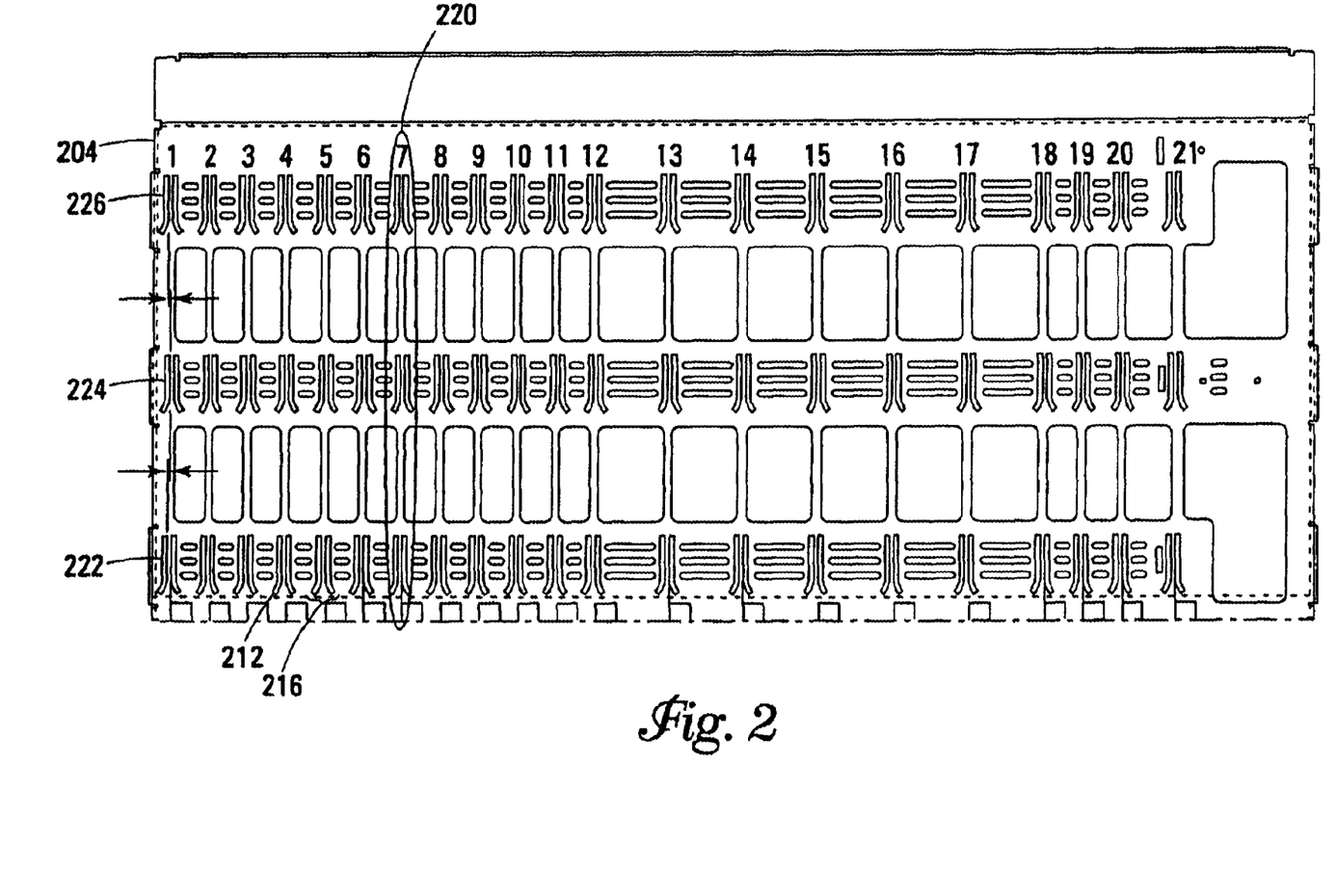
FIG. 2 is an illustration of one embodiment of a bottom frame portion for a card chassis according to the teachings of this invention.

FIG. 2 is an illustration of one embodiment of a bottom frame portion 204 for a card chassis such as card chassis 100 described with respect to FIG. 1. A plurality of guide members 212 is formed on the inner face of the bottom frame portion 204. In one embodiment, the guide members 212 are arranged in pairs 216. In one embodiment, three pairs of guide members in a row comprise a set of guide members 220. Thus as shown in FIG. 2, each row (1–21) includes three vertically aligned guide member pairs for slidably receiving a circuit card. In each row, such as row #1, the center pair of card guide members 224 is offset from the outer pairs of card guide members 222 and 226. In one embodiment, the center pair of card guide members 224 is offset by 17 1/1000th of an inch. In other embodiments, the center pair of card guide members 224 is offset from the outer pairs of card guide members 222 and 226 by an amount that does not exceed the specified bow requirements of the card. Each set of guide members, such as 220, receives and holds a circuit card in place and reduces the effects of vibration and/or movement on the electronics mounted on or in each card.

In another embodiment, guide members 212 are arranged singularly and three single guide members in a row comprise a set of guide members. In this embodiment, the center card guide member is offset from the outer card guide members. Each set of guide members holds a circuit card in place and reduces the effects of vibration and/or movement on the electronics mounted on or in each card.

In one embodiment, sets of card guide members are aligned in rows spaced along the inner surface of the bottom and top frame portions of a chassis. In another embodiment, sets of card guide members are aligned in rows spaced along the inner surface of one of the bottom or top frame portions of a chassis.

Figure 3:
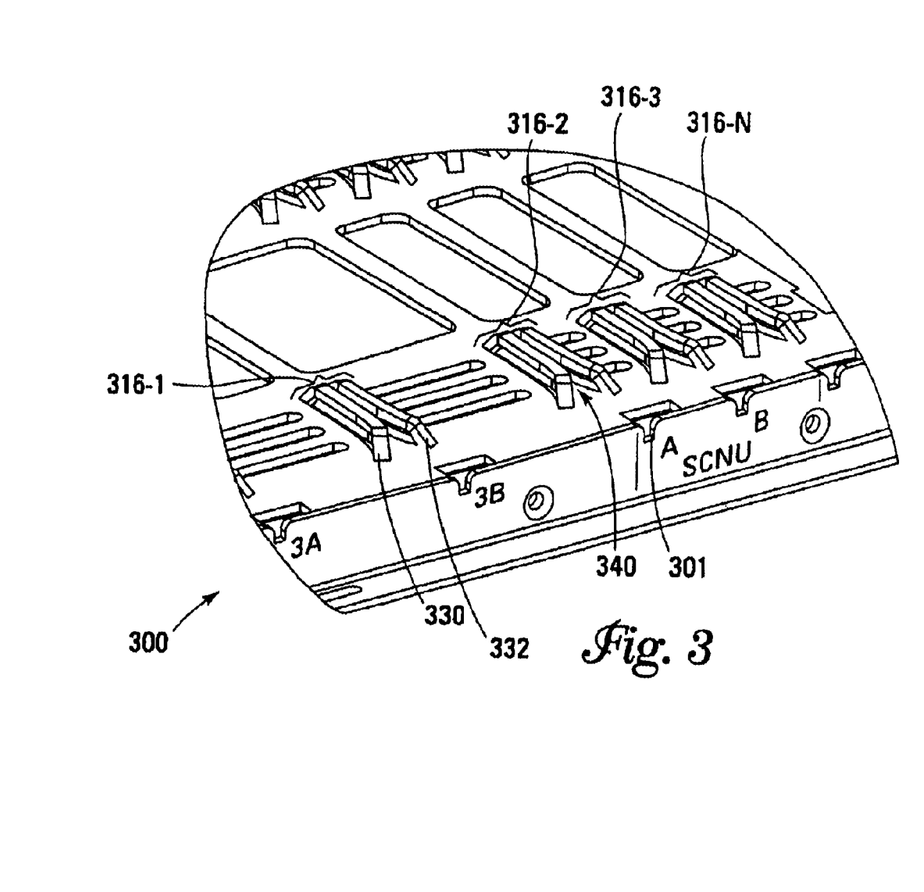
FIG. 3 is an enlarged illustration of one embodiment of a bottom frame portion for a chard chassis according to the teachings of this invention.
Figure 4:
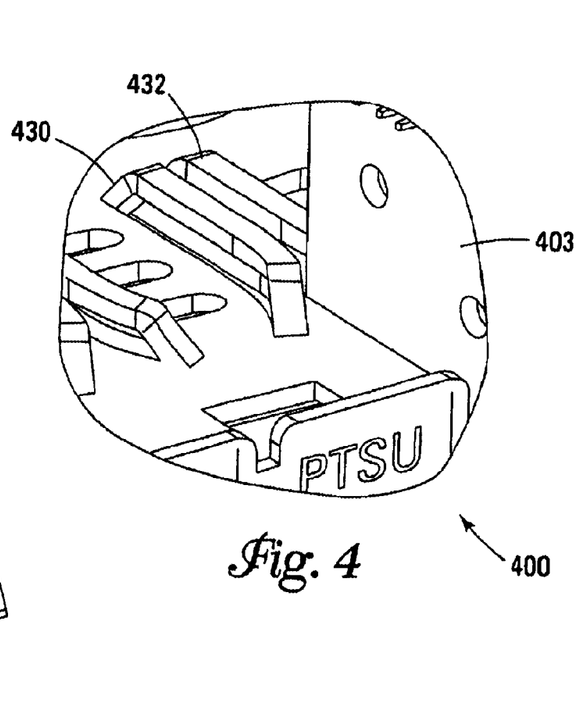
FIG. 4 is an enlarged illustration of another embodiment of a bottom frame portion for a card chassis according to the teachings of the present invention.

FIG. 3 is an enlarged illustration of one embodiment of a bottom frame portion of a card chassis shown generally at 300 and constructed according to the teachings of this invention. The bottom frame portion 300 includes a plurality of pairs of card guide members 316-1–316-N. In one embodiment, each pair of card guide members includes a left guide member 330 and a right guide member 332 that protrude from the inner face of the bottom frame portion 304 of a card chassis such as card chassis 100 described with respect to FIG. 1. The left and right guide members 330 and 332 are spaced apart from each other to form a channel or groove 340 sized to allow the groove to receive an edge of a circuit card (as shown in FIG. 4) as it is slid into the groove. In one embodiment, a portion of the inner faces of left and right guide members 330 and 332 are outwardly flanged at the end that receives a circuit card. In this manner, the channel 340 formed by guide members 330 and 332 tapers to more easily engage the edge of a circuit card as it is inserted between the pair of guide members 330 and 332. In another embodiment, left and right guide members 330 and 332 are not outwardly flanged as described with respect to FIG. 5 below.

In one embodiment, bottom frame portion 304 includes a notch 301 that aids in guiding a card to the associated card guide member 316. In one embodiment, top and bottom frame portions of a chassis, such as 100 described with respect to FIG. 1, each include notches aligned with each set of card guide members. The notches aid in guiding circuit cards to their respective card guide members. In operation, a card is set into a matching set of notches one notch on the top frame portion and one notch on the bottom frame portion of a card chassis such as chassis 100 described with respect to FIG. 1. The card is then slid into opposing sets of card guide members on the top and bottom frame portions. Multiple cards may be placed in the card chassis as needed for the specific application.

In another embodiment, an edge of a card is set on the bottom frame portion and aligned with matching sets of card guide members located on the top and bottom frame portions. The card is then slid into place between each pair of card guide members in the matching sets. The card is held in place against vibration using tension as one of the three pairs of guide members is offset from the other two pairs.

FIG. 4 is an enlarged illustration of one embodiment of a bottom frame portion of a card chassis shown generally at 400 and constructed according to the teachings of this invention. The bottom frame portion 400 includes a pair of guide members 430 and 432 receiving a circuit card 403. Guide members 430 and 432 are outwardly flanged to aid in guiding the card 403 between guide members 430 and 432. In other embodiments, guide members 430 and 432 are not flanged as described with respect to FIG. 5 below.

Figure 5:
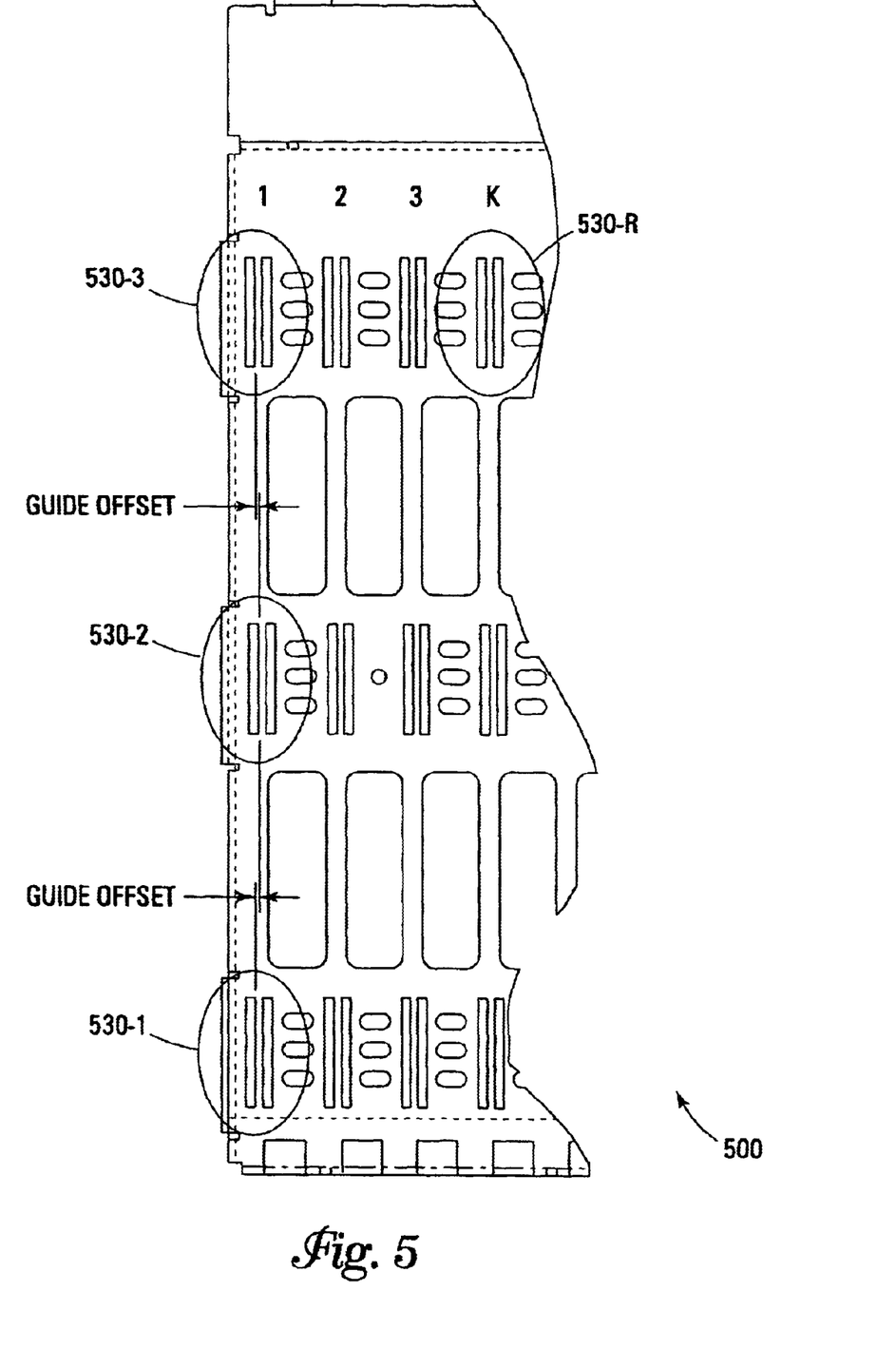
FIG. 5 is an enlarged illustration of one embodiment of a portion of a side for a card chassis according to the teachings of the present invention.

FIG. 5 is an enlarged illustration of one embodiment of a portion of a side for a card chassis shown generally at 500 and constructed according to the teachings of this invention.

It is understood that a side of a card chassis may include a top, a bottom, a left or a right side of a card chassis. The side 500 includes a plurality of pairs of guide members 530-1 to 530-R that are not flanged. Sets of card guide members are aligned in rows 1–K. In one embodiment, each set of card guide members comprises three pairs of guide members, e.g., row 1 includes three pairs of card guide members 530-1, 530-2 and 530-3. The first and third pair of card guide members 530-1 and 530-3 are aligned with each other and the second pair of card guide members 530-2 is offset from the first and third pair of card guide members 530-1 and 530-3. A set of card guide members, e.g., 530-1 to 530-3, are adapted to receive an edge of a circuit card and hold it securely in place using tension, the circuit card is bowed by the offset of the pair of card guide members 530-2.

Figure 6:
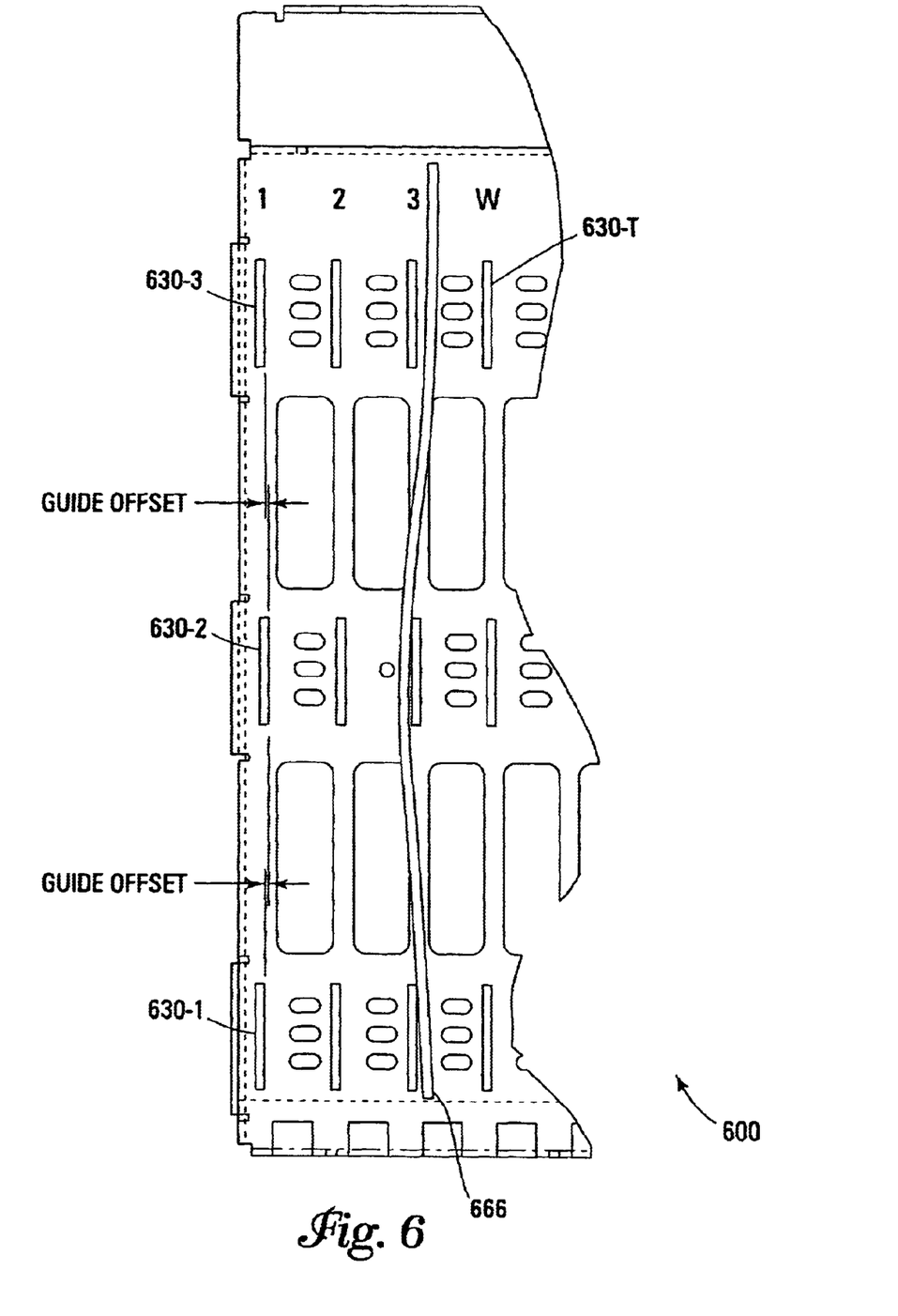
FIG. 6 is an enlarged illustration of another embodiment of a portion of a side for a card chassis according to the teachings of the present invention.

FIG. 6 is an enlarged illustration of another embodiment of a portion of a side for a card chassis shown generally at 600 and constructed according to the teachings of this invention. The side 600 includes a plurality of single guide members 630-1 to 630-T. Sets of card guide members are aligned in rows 1-W. In one embodiment, each set of card guide members comprises three single guide members, e.g., row 1 includes three card guide members 630-1, 630-2 and 630-3. The first and third card guide members 630-1 and 630-3 are aligned with each other and the second card guide member 630-2 is offset from the first and third card guide members 630-1 and 630-3. A set of card guide members, e.g. 630-1 to 630-3, are adapted to receive an edge of a circuit card and hold it securely in place using tension, the circuit card is bowed by the offset of the card guide member 630-2. Row 2 illustrates an edge of a circuit card 666 secured in place using tension.

Figure 7:
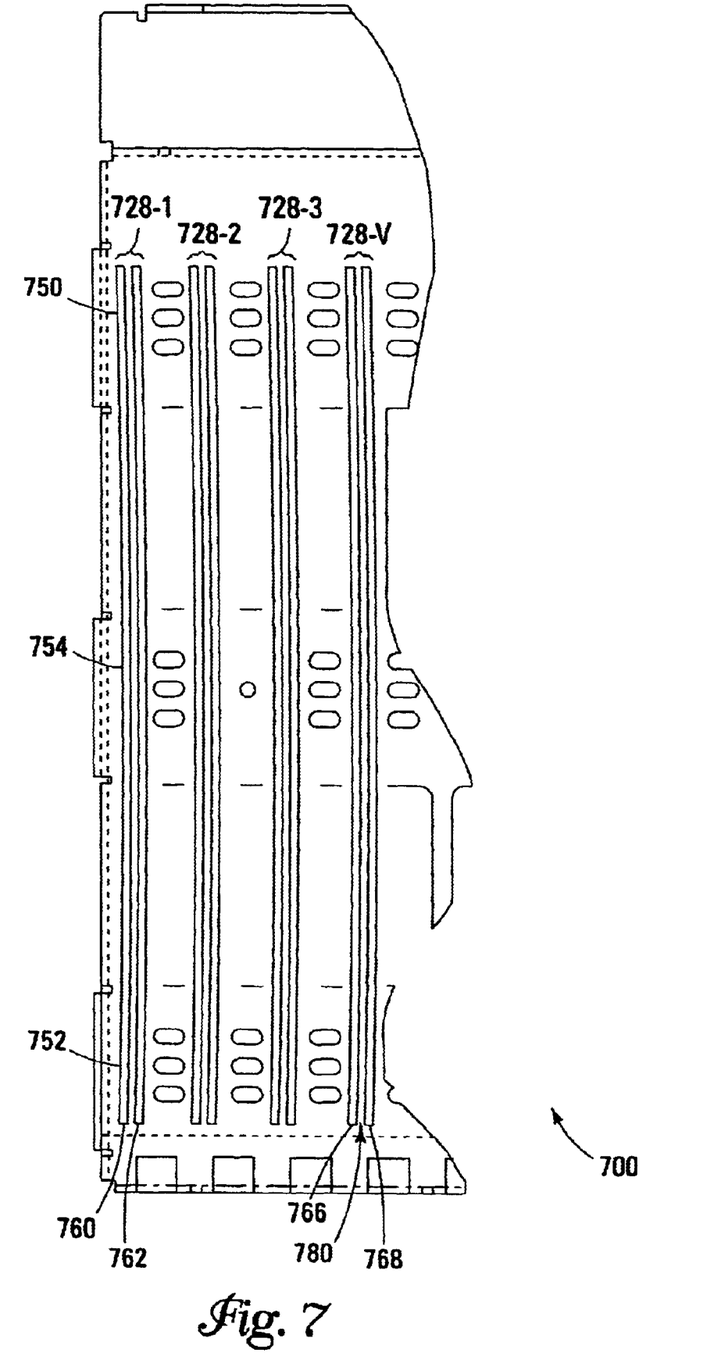
FIG. 7 is an enlarged illustration of an alternate embodiment of a portion of a side for a card chassis according to the teachings of the present invention.

FIG. 7 is an enlarged illustration of an alternate embodiment of a portion of a side for a card chassis shown generally at 700 and constructed according to the teachings of this invention. The side 700 includes a plurality of pairs of guide members 728-1 to 728-V. Each pair of guide members 728-1 to 728-V forms a single channel capable of receiving an edge of a circuit card. In one embodiment, the opposing ends 750 and 752 of a pair of guide members such as 728-1 are aligned with one another and the mid portion 754 of the pair of guide members 728-1 is offset from the ends 750 and 752. The offset is by an amount not to exceed the bow requirements of the circuit card. In one embodiment, a portion of the inner faces of left and right guide members 766 and 768 of the pair of guide members 728-V are outwardly flanged at the end that receives a circuit card. In this manner, the channel 780 formed by guide members 766 and 768 tapers to more easily engage the edge of a circuit card as it is inserted between the pair of guide members 766 and 768. A pair of card guide members, e.g. 728-1 or 728-V, are each adapted to receive an edge of a circuit card and hold it securely in place using tension, the circuit card is bowed by the mid point offset of the card guide members.

Conclusion

In one embodiment, a chassis has been described. The chassis includes a bottom frame portion having at least one set of card guide members. The at least one set of card guide members is adapted to receive a circuit card and secure the circuit card using tension. When the circuit card is received by the at least one set of card guide members the circuit card is bowed.

In another embodiment, a card guide system has been described. The card guide system comprises a chassis having a top and a bottom frame portion. The top and bottom frame portions each including a plurality of card guide members disposed thereon. The card guide members of the top frame portion are a mirror image of the card guide members of the bottom frame portion. In addition, the plurality of card guide members are adapted to receive a circuit card and secure the circuit card using tension, wherein when the circuit is received by the card guide members the circuit card is bowed.

In an alternate embodiment, a host digital terminal has been described. The host digital terminal includes a card mounting enclosure having a first side and a second opposing side. The first and second sides each having a plurality of sets of card guide members disposed thereon. The sets of card guide members of the first side each include a matching set of card guide members disposed on the second side. Matching sets of card guide members are adapted to receive a circuit card and secure the circuit card using tension. When the circuit card is received by matching sets of card guide members the circuit card is bowed. The host digital terminal further includes a plurality of circuit cards. Each of the plurality of circuit cards is secured by a matching set of card guide members.

Although specific embodiments have been illustrated and described herein, it will be appreciated by those of ordinary skill in the art that any arrangement, which is calculated to achieve the same purpose, may be substituted for the specific embodiments shown. For example, although a telecommunication host digital terminal is used to describe the invention it is understood that any card mounting enclosure may utilize this invention. In addition, although the card guide system described herein is disposed on the top and/or bottom frame portions, it is understood that the card guide system could be used on the two opposite sides of the chassis rather than the top and bottom. This application is intended to cover any adaptations or variations of the present invention. Therefore, it is intended that this invention be limited only by the claims and the equivalents thereof.

What is claimed is:

1. A chassis, comprising:
   a bottom frame portion having at least one set of card guide members;
   wherein the at least one set of card guide members is adapted to receive a circuit card and secure the circuit card using tension; and
   wherein when the circuit card is received by the at least one set of card guide members the circuit card is bowed.

2. The chassis of claim 1, wherein the at least one set of card guide members comprises a first, a second, and a third pair of card guide members, wherein the first and third pair of card guide members are aligned with one another and the second pair of card guide members is offset from the first and third pair of card guide members.

3. The chassis of claim 2, wherein each pair of card guide members includes a left and a right guide member that are outwardly flanged to aid in receiving the circuit card.

4. The chassis of claim 1, further comprising wherein the amount that the circuit card is bowed is enough to secure the circuit card in place.

5. The chassis of claim 1, wherein the bottom frame portion further includes a notch aligned with the at least one set of card guide members, wherein the notch is designed to receive an edge of the circuit card.

6. A chassis, comprising:
   a first side having a first set of card guide members disposed thereon;

a second, opposing side having a second set of card guide members disposed thereon, wherein the first and second sets or card guide members are mirror images of each other; and wherein the first and second sets of card guide members are adapted to receive a circuit card and secure the circuit card using tension, wherein when the circuit card is received by the first and second sets of card guide members the circuit card is bowed.

7. The chassis of claim 6, further comprising wherein the amount of bow is enough to secure the circuit card in place.

8. The chassis of claim 6, wherein the first and second sets of card guide members each comprise three card guides wherein the second card guide is offset from the first and third card guides.

9. The chassis of claim 8, wherein the three card guides comprise three pairs of card guide members.

10. The chassis of claim 9, wherein each pair of card guide members includes a left and a right guide member that are outwardly flanged to aid in receiving the circuit card.

11. The chassis of claim 6, wherein the second side further includes a notch aligned with the second set of card guide members, wherein the notch is designed to receive and edges of the circuit card.

12. The chassis of claim 6, wherein the first side further includes a first notch aligned with the first set of card guide members, wherein the notch is designed to receive an edge of the circuit card.

13. The chassis of claim 12, wherein the second side further includes a second notch aligned with the second set of card guide members, wherein the notch is designed to receive an opposing edge of the circuit card.

14. A card guide system, comprising:

a chassis having a top and a bottom frame portion;

the top and bottom frame portions each including a plurality of card guide members disposed thereon, wherein the card guide members of the top frame portion are a mirror image of the card guide members of the bottom frame portion; and wherein the plurality of card guide members are adapted to receive a circuit card and secure the circuit card using tension, wherein when the circuit is received by the card guide members the circuit card is bowed.

15. The system of claim 14, further comprising wherein the amount that the circuit card is bowed is enough to secure the circuit card in place.

16. The system of claim 14, wherein the plurality of card guide members disposed on the top and bottom frame portions each comprise:

a plurality of sets of card guide members;

wherein each set comprises a first, a second and a third card guide; and wherein the first and third card guides are aligned with each other and the second card guide is offset from the first and third card guides.

17. The system of claim 14, wherein the plurality of card guide members disposed on the top and bottom frame portions each comprise:

a plurality of sets of card guide members;

wherein each set comprises a first, a second and a third pair of card guides; and wherein the first and third pairs of card guides are aligned with each other and the second pair of card guides is offset from the first and third pair of card guides.

18. The system of claim 17, wherein each pair of card guides includes a left and a right guide member that are outwardly flanged to aid in receiving the circuit card.

19. The system of claim 17, wherein the bottom frame portion further includes a plurality of notches, each notch aligned with one of the plurality of sets of card guide members, wherein the plurality of notches are designed to receive an edge of the circuit card.

20. The system of claim 17, wherein the top frame portion further includes a plurality of notches, each notch aligned with one of the plurality of sets of card guide members, wherein the plurality of notches are designed to receive an edge of the circuit card.

21. The system of claim 17, wherein the top and bottom frame portion each include a plurality of notches, each notch aligned with one of the plurality of sets of card guide members, wherein the plurality of notches are designed to receive an edge of the circuit card.

* * * * *